United States Patent
Abe

(10) Patent No.: US 7,892,864 B2
(45) Date of Patent: Feb. 22, 2011

(54) CHARGED PARTICLE BEAM IRRADIATION METHOD AND SEMICONDUCTOR DEVICE MANUFACTURING METHOD

(75) Inventor: Hideaki Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 11/882,070

(22) Filed: Jul. 30, 2007

(65) Prior Publication Data
US 2008/0050848 A1    Feb. 28, 2008

(30) Foreign Application Priority Data
Jul. 31, 2006 (JP) ............................... 2006-208940

(51) Int. Cl.
    *H01L 21/66* (2006.01)
(52) U.S. Cl. ............ 438/14; 438/16; 257/E21.53; 257/E21.529
(58) Field of Classification Search ............ 438/14, 438/16; 257/E21.53, E21.529, E21.521
    See application file for complete search history.

(56) References Cited

U.S. PATENT DOCUMENTS

| 6,157,451 | A | 12/2000 | Mizuno |
| 6,366,688 | B1 | 4/2002 | Jun et al. |
| 6,636,824 | B1 | 10/2003 | Sawai et al. |
| 6,803,572 | B2 * | 10/2004 | Veneklasen et al. ............ 850/9 |
| 2003/0201391 | A1 * | 10/2003 | Shinada et al. ............... 250/307 |
| 2005/0176159 | A1 * | 8/2005 | Kang ........................... 438/14 |
| 2006/0134810 | A1 * | 6/2006 | Bullock ......................... 438/5 |
| 2008/0054931 | A1 * | 3/2008 | Zhao et al. ................... 324/765 |
| 2008/0061233 | A1 * | 3/2008 | Ogawa ........................ 250/307 |

OTHER PUBLICATIONS

Ose et al.; "Improved CD-SEM Optics With Retarding and Boosting Electric Fields"; SPIE, vol. 3677, pp. 930-939, (1999).

* cited by examiner

*Primary Examiner*—Caridad M Everhart
(74) *Attorney, Agent, or Firm*—Finnegan, Henderson, Farabow, Garrett & Dunner, L.L.P.

(57) ABSTRACT

A charged particle beam irradiation method includes setting an observation region on a sample, the sample including an object pattern to be observed, and the observation region including the object pattern, setting an irradiation region on the sample, the irradiation region being to be irradiated with a charged particle beam, the irradiation region including the observation region and being larger than the observation region, setting a non-irradiation region in the irradiation region, the non-irradiation region failing to be irradiated with the charged particle beam, irradiating the irradiation region except the non-irradiation region with the charged particle beam, and irradiating the observation region with a charged particle beam after the irradiating the irradiation region except the non-irradiation region with the charged particle beam.

16 Claims, 4 Drawing Sheets

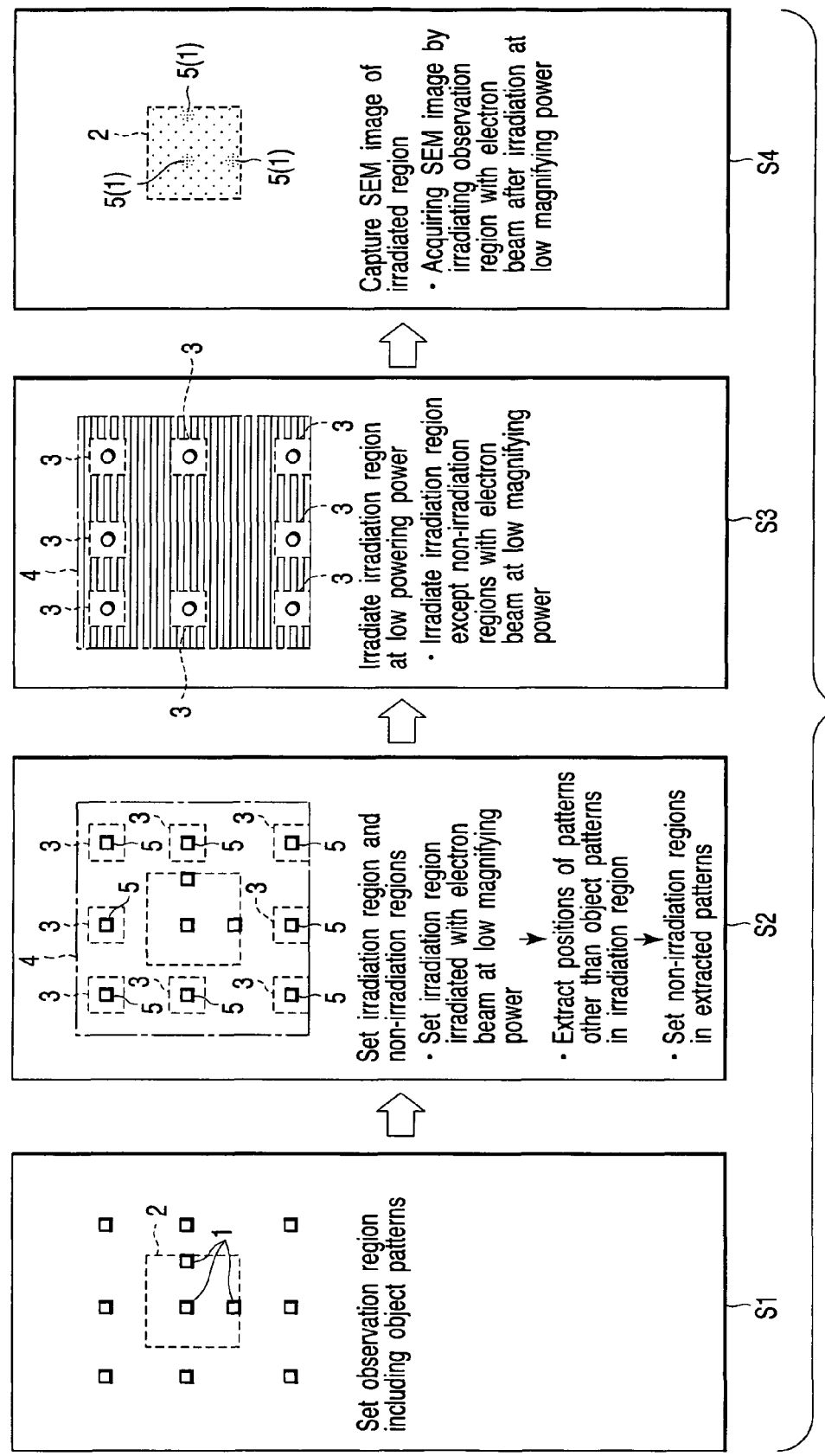
F I G. 1

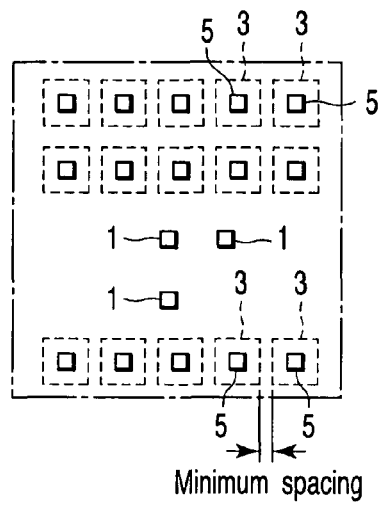
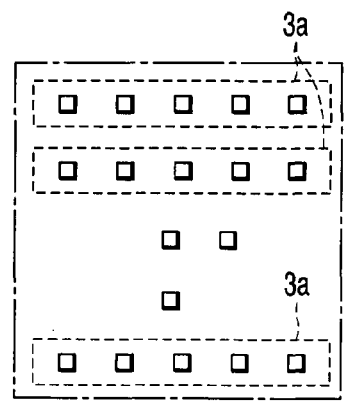
FIG. 2A      FIG. 2B
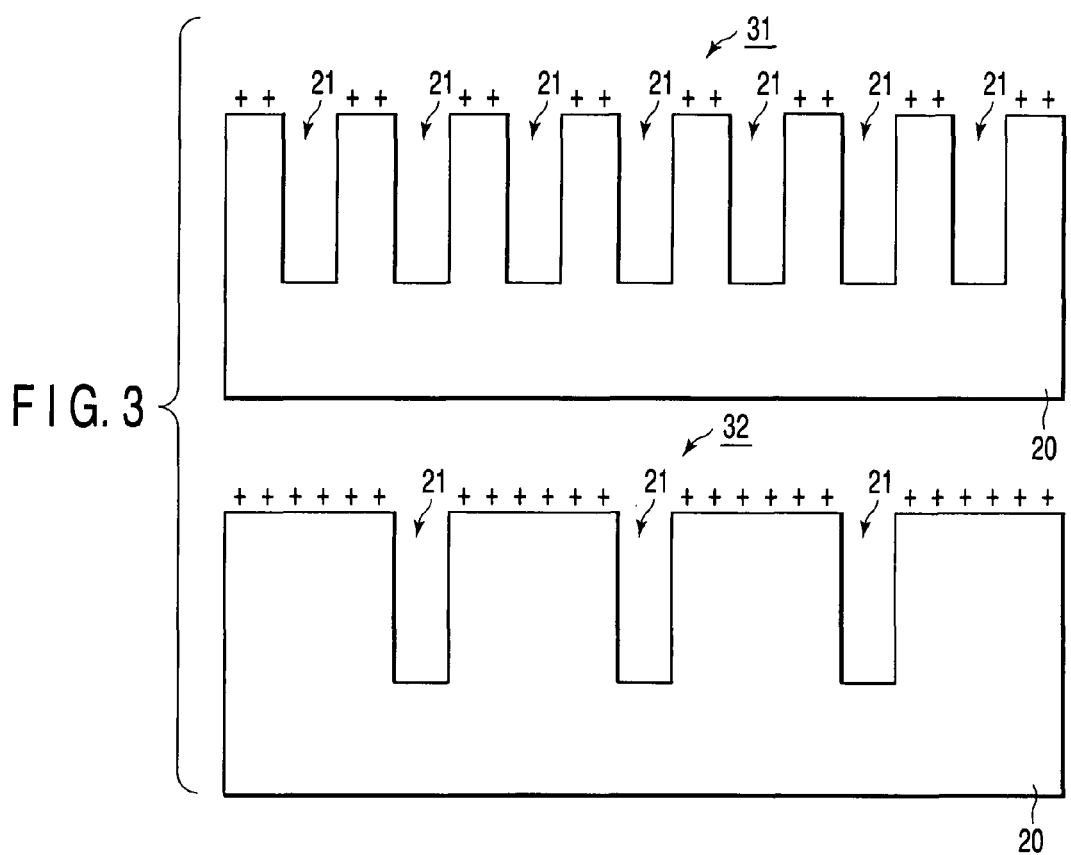
FIG. 3

CHARGED PARTICLE BEAM IRRADIATION METHOD AND SEMICONDUCTOR DEVICE MANUFACTURING METHOD

CROSS-REFERENCE TO RELATED APPLICATIONS

This application is based upon and claims the benefit of priority from prior Japanese Patent Application No. 2006-208940, filed Jul. 31, 2006, the entire contents of which are incorporated herein by reference.

BACKGROUND OF THE INVENTION

1. Field of the Invention

The present invention relates to a charged particle irradiation method used for observation of a sample and a method for manufacturing a semiconductor device.

2. Description of the Related Art

In general, an electron microscope has been used as an apparatus for observing semiconductor patterns. In particular, in applications where patterns are observed and their dimensions/shapes are measured during the manufacturing process, a CD-SEM (Critical Dimension-Scanning Electron Microscope) has bee used widely which has an automatic measuring function built in.

As the dimensions of semiconductor devices have been scaled down, the diameter of an electro beam has been reduced and hence the resolution of the CD-SEM has been increased. Furthermore, as the dimension measuring function and the focus adjusting function have advanced, the measurement accuracy of the CD-SEM has greatly improved. For this reason, the CD-SEM has become one important tool in observing local pattern shapes and variations in dimension.

Semiconductor patterns include various types of patterns. One of the types of patterns which is important in improving the performance of semiconductor devices and the manufacturing yield is hole patterns. The hole patterns include contact hole patterns for connection to an Si substrate and via hole patterns for connection between interconnect lines. With these hole patterns, it is important that the dimensions and shapes of holes be proper.

In recent years, as the dimensions of semiconductor devices have been scaled down, the diameter of holes has decreased and their depth have increased; thus, the ratio of the hole depth to the hole diameter, that is, the aspect ratio, has greatly increased. For the formation of hole patterns having high aspect ratio, difficult processing conditions are selected. Therefore, highly accurate measurement and control is demanded to determine whether proper hole patterns have been formed.

Until now, it has been difficult to observe a hole pattern having high aspect ratio on a CD-SEM. The reason is that secondary electrons emitted from the bottom of a hole collide with the sidewall of that hole, failing to arrive at a secondary electron detector in the electron optical system.

As a method of observing the hole bottom brightly, a method has bee proposed which, immediately before observing a hole pattern at a high magnifying power, irradiates the hole pattern with an electron beam at a magnifying power lower than the observation power (Y. Ose, M. Ezumi, H. Todokoro, "Improved CD-SEM Optics with Retarding and Boosting Electric Field", Proc. SPIE 3677, pp. 930-939 (1999)).

Under conditions of a high magnifying power, the area of an irradiation region is set to, say, $1.0\,\mu m\square$. Under conditions of a low magnifying power, on the other hand, the area is set to, say, $100\,\mu m\square$. The aforementioned method utilizes a phenomenon in which, by irradiating a wide region with an electron beam, the surface of a sample in this wide region is more positively charged than in a narrow region (hole pattern). This causes an effect of bringing secondary electrons at the hole bottom to the detector side. The aforementioned method has made it possible to observe the shape of the hole bottom and measure its dimensions.

However, no application of the aforementioned method to observation of a semiconductor device having various fine hole patterns has been reported and its effectiveness has not become apparent.

BRIEF SUMMARY OF THE INVENTION

According to an aspect of the present invention, there is provided a charged particle beam irradiation method comprising: setting an observation region on a sample, the sample including an object pattern to be observed, and the observation region including the object pattern; setting an irradiation region on the sample, the irradiation region being to be irradiated with a charged particle beam, the irradiation region including the observation region and being larger than the observation region; setting a non-irradiation region in the irradiation region, the non-irradiation region failing to be irradiated with the charged particle beam; irradiating the irradiation region except the non-irradiation region with the charged particle beam; and irradiating the observation region with a charged particle beam after the irradiating the irradiation region except the non-irradiation region with the charged particle beam.

According to another aspect of the present invention, there is provided a method for manufacturing a semiconductor device comprising: preparing a sample including an object pattern to be measured; measuring a measurement item used in determining whether the object pattern is acceptable or unacceptable, the measuring the measurement item including irradiating the sample with a charged particle beam using a charged particle beam irradiation method and observing the object pattern, the charged particle beam irradiation method comprising setting an observation region on a sample, the sample including an object pattern to be observed, and the observation region including the object pattern; setting an irradiation region on the sample, the irradiation region being to be irradiated with a charged particle beam, the irradiation region including the observation region and being larger than the observation region; setting a non-irradiation region in the irradiation region, the non-irradiation region failing to be irradiated with the charged particle beam; irradiating the irradiation region except the non-irradiation region with the charged particle beam; and irradiating the observation region with a charged particle beam after the irradiating the irradiation region except the non-irradiation region with the charged particle beam; determining whether or not a measured value of the measurement item falls within a predetermined range; and proceeding to the next manufacturing process when the measured value falls within the predetermined range, repairing the object pattern or disposing the sample when the measured value does not fall within the predetermined range.

BRIEF DESCRIPTION OF THE SEVERAL VIEWS OF THE DRAWING

FIG. 1 is a diagram illustrating a flow of processing method including an electron beam irradiation method of a first embodiment;

FIGS. 2A and 2B show an example of arrangement of non-irradiation regions having their spacing set very small;

FIG. 3 is a diagram for explaining an example of pattern which is easy to cause charge variation depending on pattern layout (covering rate of an upper film);

DETAILED DESCRIPTION OF THE INVENTION

Figure 4:
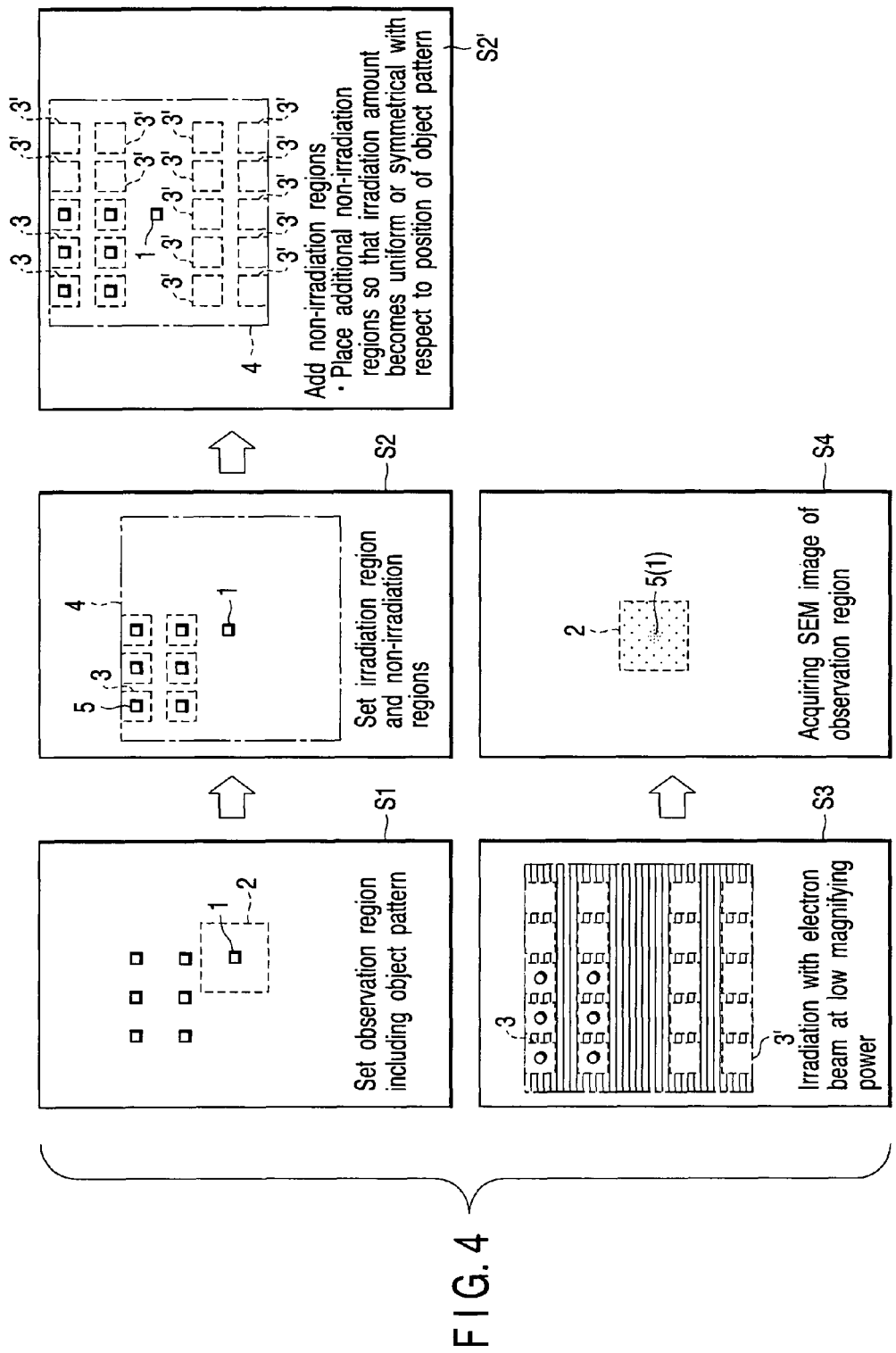
FIG. 4 is a diagram illustrating a flow of processing method including an electron beam irradiation method of a second embodiment.

The inventor have made it obvious that the aforementioned method, i.e., the method irradiating the hole pattern with the electron beam at the magnifying power lower than the observation power immediately before observing the hole pattern at the high magnifying power (observation power), has hitherto unknown problem as a layout of semiconductor pattern complicates. This point will be explained in detail hereinafter.

First, in the case of a layout in which both a hole pattern having low aspect ratio and a hole pattern having high aspect ratio are present, it is difficult to brightly observe the hole bottom of the pattern having high aspect ratio. When two patterns are present in an irradiation region to be observed at a low magnifying power, the hole pattern having low aspect ratio first becomes bright and then the hole pattern having high aspect ratio is observed brightly. For example, when the two patterns differ in hole depth about twofold, a difference occurs in brightness. Specifically, when the diameter of the hole pattern is 100 nm, its depth is 500 nm, it is possible to brightly observe the hole pattern in several seconds, and when the hole depth is 1000 nm, it is impossible to brightly observe the hole pattern unless the hole pattern is not irradiated for at least ten seconds.

However, when the irradiation of the hole pattern having high aspect ratio with an electron beam at a low magnifying power is continued until its bottom can be observed brightly, an excess of secondary electrons is emitted from the bottom of the hole pattern having low aspect ratio, which results in the hole bottom becoming excessively bright. Further irradiation causes discharge between the sample surface and the hole bottom or between the objective lens and the hole bottom, which results in electrostatic destruction of the sample. Therefore, when hole patterns which have the same diameter but are different in depth (500 nm and 1000 nm) are present in the same region irradiated with the electron beam, the hole pattern having smaller depth becomes bright earlier, and an attempt is made to observe the hole pattern having larger depth, there arises the possibility that the sample may be destroyed in the shallow hole.

To prevent the destruction of the sample, it is required to determine an irradiation condition suitable for the hole pattern having low aspect ratio, but under the condition, the bottom of the hole pattern having high aspect ratio is not observed brightly. It is supposed that the irradiation condition at low magnifying power differs not only the effect of aspect, but also the effect of hole diameter, shape of hole or material of hole bottom.

Next, another problem will be explained. Depending on the pattern layout, charges at the surface become nonuniform in the irradiation region. In this case, the electron beam is affected by an electric field generated at the surface of the sample, thereby the electron beam light enters obliquely or a gradual electron beam image movement (drift) phenomenon occurs. As a result, it becomes difficult to properly observe and measure the pattern.

Hereinafter, the embodiments taking the above circumstances into consideration will be described with reference to the accompanying drawings.

FIRST EMBODIMENT

FIG. 1 is a diagram illustrating a flow of processing method including an electron beam irradiation method of a first embodiment.

[Step 1]

A sample includes object patterns 1 to be inspected. An observation region (magnifying power, field of view, etc.) 2 is set on the sample. The observation region includes the object patterns 1. In the present embodiment, the object patterns 1 are explained as hole patterns. So, design data (CAD data) including the object patterns 1 as a objects for observing hole bottoms and as objects for measuring is prepared, and positions of the object patterns 1 and the observation region 2 are set on the design data.

The positions of the object patterns 1 may be set by pointing the design data 1 displayed on a GUI or may be set using coordinate numeric data if the coordinates of the object patterns are known.

The observation region 2 is set according to desired resolution and measurement accuracy. To make use of the resolution of the DC-SEM, it is desired to set the size of the region such that the beam diameter is coincident with the pixel size of SEM image.

[Step 2]

Next, an irradiation region 4 to be irradiated with an electron beam is set on the sample. The irradiated condition (irradiation time, etc.) of electron beam is selected such that the observation is performed at low magnifying power. The irradiation condition such as the irradiation region 4 or irradiation time is determined according to the hole diameter, the aspect ratio and the material of the object patterns 1. The irradiation region 4 needs to be larger than the observation region 2.

The reason to make the irradiation region 4 larger than the observation region 2 is as follows:

With the conventional method using a CD-SEM, it is difficult to observe a hole pattern having high aspect ratio because secondary electrons emitted from the hole bottom collide with the sidewall of the hole pattern and thus fail to arrive at the secondary electron detector in the electron optical system. To observe the hole bottom brightly, a method has been proposed which, immediately before observing the hole pattern at a high magnifying power, irradiates the sample with an electron beam at a magnifying power lower than the observation power. This method irradiates a large region with the electron beam to cause the sample surface to be more positively charged than when a small area is irradiated with an electron beam, thus allowing secondary electrons emitted from the hole bottom to be led to the detector. The use of this method allows the shape of the hole bottom to be observed and moreover the dimensions of the hole bottom to be measured.

Next, the positions (coordinates) of patterns (non-object patterns) 5 other than the object patterns 1 which are present in the irradiation region 4 are all extracted from the design data.

At this time, it is possible to search the desired pattern in the design data corresponding to the irradiation region 4 by using the feature parameter of the desired pattern. For example, in the case of a circular pattern, it is search by desired closed pattern whose one side length (feature parameter) is set on a certain threshold value. In the case of an ellipse, it can be searched using length of each of the long and short sides as the feature parameters. Specifically, in the case of a hole pattern of 100 nm in design dimension, it is only required to extract a closed pattern of 110 nm square.

In the case where the hole pattern and the line pattern are mixed, only the hole pattern can be extracted by setting non-irradiation regions 3 as described above.

In addition, it is possible to use a method which uses position (coordinate) information of apexes in the design data as the feature parameters and extracts a region which overlaps with the apexes by searching inside of the irradiation region 4 based on the positional relations of the apexes. In this case, by allowing the apex-to-apex distance some latitude in determining that the apexes are coincident with each other, similar pattern shapes can be extracted.

In this manner, even if various pattern shapes are mixed, it becomes possible to extract desired non-irradiated patterns by presetting feature parameters that define the features of the non-irradiated patterns and extracting patterns having the feature parameters (patterns that match the feature parameters) from among patterns other than object patterns present in the irradiation region.

Next, regions which are not irradiated with the electron beam at low magnifying power, that is, non-irradiation regions 3 are set on the extracted hole patterns.

The size of the non-irradiation region 3 is adjusted according to the size of the hole pattern and the layout of peripheral hole patterns. For example, when the hole pattern is placed in isolation, the non-irradiation region 3 is set a little on the large side (e.g., twenty times as large as the hole diameter).

Conversely, when the hole patterns are placed very closely, the non-irradiation region 3 is set a little on the small side (e.g., five times as large as the hole diameter), because the non-irradiation region 3 is made large, the irradiated area at low magnifying power becomes reduced.

Furthermore, when hole patterns are placed in a row, one non-irradiation region is set for all these hole patterns and not for each of the hole patterns. This allows the electron beam irradiation to be carried out in an efficient manner.

In addition, there is the possibility that the non-irradiation regions 3 may be placed so that their spacing is very small. In such a case, the minimum spacing between irradiation regions is set in advance, and a region between the non-irradiation regions which is below the minimum spacing is set as a non-irradiation region.

FIGS. 2A and 2B each illustrate an example of arrangement of non-irradiation regions when their spacing is very small. FIG. 2A shows an arrangement of non-irradiation regions in which the spacing of horizontally adjacent non-irradiation regions is below the minimum spacing. In this case, the region between adjacent non-irradiation regions 3 is also set as a non-irradiation region. As a result, the non-irradiation regions 3 of FIG. 2A changes to a non-irradiation region 3a of FIG. 2B. Thereby, only blanking in the vertical direction is required. As above, by optimizing non-irradiation regions according to the pattern layout, the electron beam irradiation can be performed in an efficient manner.

[Step 3]

Next, the irradiation region is irradiated with the electron beam at low magnifying-power.

At this time, the electron beam irradiation is irradiated in accordance with the irradiation condition set up in step S2, but the non-irradiation regions 3 are not irradiated with the electron beam.

For that purpose, for example, in the case where the sample is scanned with the electron beam, the electron beam is deflected by inputting a signal, which includes a horizontal scanning signal of a transverse direction of an SEM image, a vertical scanning signal of a longitudinal direction of the SEM image and sawtooth signals added therein, into a deflection control unit which controls a deflecting system in an electron optics system. In order to prevent the non-irradiation regions 3 from being scanned by the electron beam, a deflecting unit for blanking is provided in addition to the deflecting unit for scanning. When the scanning signals direct the electron beam to the non-irradiation region, the deflecting unit for blanking is set to deflect the electron beam very greatly (blanking) so as not to irradiate the sample with the electron beam.

Such a blanking operation is performed for each of the non-irradiation regions 3 on the peripheral of the hole patterns extracted in step S2, thereby obtaining a state in which the irradiation region 4 including the object patterns is scanned with the electron beam without irradiating the non-irradiation regions 3 with the electron beam.

[Step S4]

Next, an SEM image 6 (the dimensions of the object patterns) of the observation region is acquired. For that purpose, after the completion of irradiation under the preset irradiation conditions at low magnifying power, the observation region 2 is irradiated with an electron beam to observe the object patterns and obtain their dimensions.

Here, the purpose of irradiating the irradiation region is to charge the surface of the sample positively. Therefore, the irradiation condition for the irradiation region is generally selected such that the sample is positively charged at high speed by varying accelerating voltage and sample current. On the other hand, the purpose of irradiating the observation region is to observe the observation patterns at high resolution. Therefore, the irradiation condition for the observation region is generally selected such that the object patterns is observed finely and stably. If a condition which satisfy the above two conditions can be set, the irradiation condition for the irradiation region and the irradiation condition for the observation region may be the same. The conditions for the irradiation region and observation regions vary according to the material of the sample and the pattern size.

In step S4, as the object patterns 1 are irradiated with the electron beam under the proper observation conditions (high magnifying power), the hole bottoms are observed brightly. On the other hand, as the hole patterns other than the object patterns 1 are not irradiated with the electron beam at low magnifying power, the secondary electrons are not emitted in large quantities from the hole bottom, thereby the main cause for making a surface of the sample unstable condition, such as large amount of emitted electron from the hole bottom is suppressed.

The dimensions of object patterns maybe obtained by observing the observation region using a technique other than the technique acquiring the SEM image.

In steps S1 and S2, the object patterns are set and the hole patterns in the irradiation region are extracted by using design data (CAD data), however, it is also possible to extract the positions of the hole patterns in advance using the CD-SEM without using the design data. This can be realized by extracting hole patterns from an SEM image using image processing when observing an irradiation region 4 at a low magnifying power in a different place having the same pattern layout and then calculating coordinates of the hole patterns. In addition, this can also be realized by acquiring the SEM images in the irradiation region 4 in sequence under the condition such that the magnifying power does not cause discharge and the magnifying power is lower than the observation power.

In addition, in the present embodiment, the electron beam is given as an example, but the method can be applied to an ion beam irradiation method, a charged particle (such as a positrons) irradiation method, or an X-ray irradiation method.

In addition, in the present embodiment, the hole pattern is given as an example of the pattern which easily causes the variation of charged state of the sample surface by irradiating electron beam at low magnifying power, but the present embodiment may be applied to other patterns, such as a trench pattern (e.g., damascene type interconnection pattern) or a pattern having complex shapes, which are easy to case variation of charged state depending on a pattern layout (coverage of a film to be processed into a pattern (hereinafter referred to as an upper film)).

The depending on the pattern layout (coverage of the upper film) means, for example, as follows. In the case of trench pattern, as shown in FIG. 3, there exists a pattern layout 31 in which the density of trenches 21 is high and a pattern layout 32 in which the density of trenches 21 is low.

In comparison with the pattern layout 32, in the pattern layout 31, the trenches 21 occupy a large percentage (coverage) of the surface of an upper layer 20 (here, an insulating film). In comparison with the pattern layout 32, the pattern layout 31 is hard to cause variation of charged state. This is because, in the pattern layout 31, a smaller amount of positive charge is charged on the outside of the trenches 21 than in the pattern layout 32.

In addition, in the present embodiment, the technique to irradiate the sample with the electron beam at low magnifying power before the observation as an example of the technique to observe the hole bottom brightly, the present embodiment is not limited to the irradiating technique, but the present embodiment is applicable to all techniques for observing the hole bottom brightly (for example, a technique irradiating charged particles such as an ion beam or positrons, or a technique irradiating an X-ray irradiation technique).

SECOND EMBODIMENT

FIG. 4 is a diagram illustrating a flow of processing method including an electron beam irradiation method according to a second embodiment.

In the first embodiment, regions except an observation region including object patterns are set as non-irradiation regions which are not irradiated with the electron beam at low magnifying power.

However, depending on the pattern layout, it may be better to irradiate a part of the non-irradiation regions specified in the first embodiment. For example, in the case where a pattern arrangement has a difference in pattern density, it is better to irradiate a part of the non-irradiation regions specified in the first embodiment. Specifically, as shown in FIG. 4, it is the case where the object patterns is an isolated hole pattern and hole patterns are densely arranged in the upper left portion of the irradiation region. Hereinafter, the electron beam irradiation method of the present embodiment will be further described.

[Step S1]

First, as in the first embodiment, an observation region 2 including the object pattern 1 is set.

[Step S2]

Next, as in the first embodiment, an irradiation region 4 and non-irradiation regions (first non-irradiation regions) 3 are set.

[Step S2']

Next, non-irradiation regions (second non-irradiation regions) are added. For that purpose, the uniformity and symmetry of the irradiation amount when the entire irradiation region is irradiated with the electron beam are calculated based on the positions and size (the length of X and Y, the area, etc.) of the non-irradiation regions 3 set in step S2.

Here, since the non-irradiation regions are concentrated in the upper left portion, the irradiation amount of electron beam tends to concentrate on the lower and right sides.

Therefore, calculation is performed so as to make the irradiation amount uniform and symmetrical with the object pattern at center, that is, so as to place the non-irradiation regions uniformly throughout the irradiation region.

In the above calculation, for instance, it is supposed to placed the non-irradiation regions such that the position of the object pattern and the position of the center of gravity of the non-irradiation regions coincide with each other. As a result, additional non-irradiation regions 3' are placed in the lower and right portions of the irradiation region where no pattern is present and the irradiation amount is made uniform and symmetrical as viewed from the position 5 of the object pattern.

[Step S3]

Next, as in the first embodiment, the irradiation region (the region except the first and second non-irradiation regions) is irradiated with the electron beam at low magnifying power. At this time, since the second non-irradiation regions 3' are set so that the irradiation amount becomes uniform and symmetrical with the object pattern position at center, the uniformity and symmetry of the electron beam in the irradiation region becomes higher than in the case where the second non-irradiation regions 3' are not irradiated with the electron beam.

[Step S4]

Next, as in the first embodiment, an SEM image (the dimensions of the object pattern) of the observation region is acquired.

According to the present embodiment, by further placing the second non-irradiation regions 3' in places where no pattern is present in order to increase the uniformity and symmetry of the electron beam in the irradiation region, the influence of electric field generated at the sample surface on the electron beam can be reduced, thereby, the electron beam can be prevented from entering obliquely the sample surface or the electron beam image can be prevented from drifting gradually, therefore, the pattern can be observed and measured correctly.

As with the first embodiment, the second embodiment can also be modified in various ways.

THIRD EMBODIMENT

Next, a method for manufacturing a semiconductor device of the present embodiment will be explained. The method for manufacturing the semiconductor device of the present embodiment is an example of applying the processing method (EB irradiation pattern measuring method) including the electron beam irradiation method of the aforementioned embodiment to a pattern dimension measuring step in a semiconductor manufacturing process.

Figure 5:
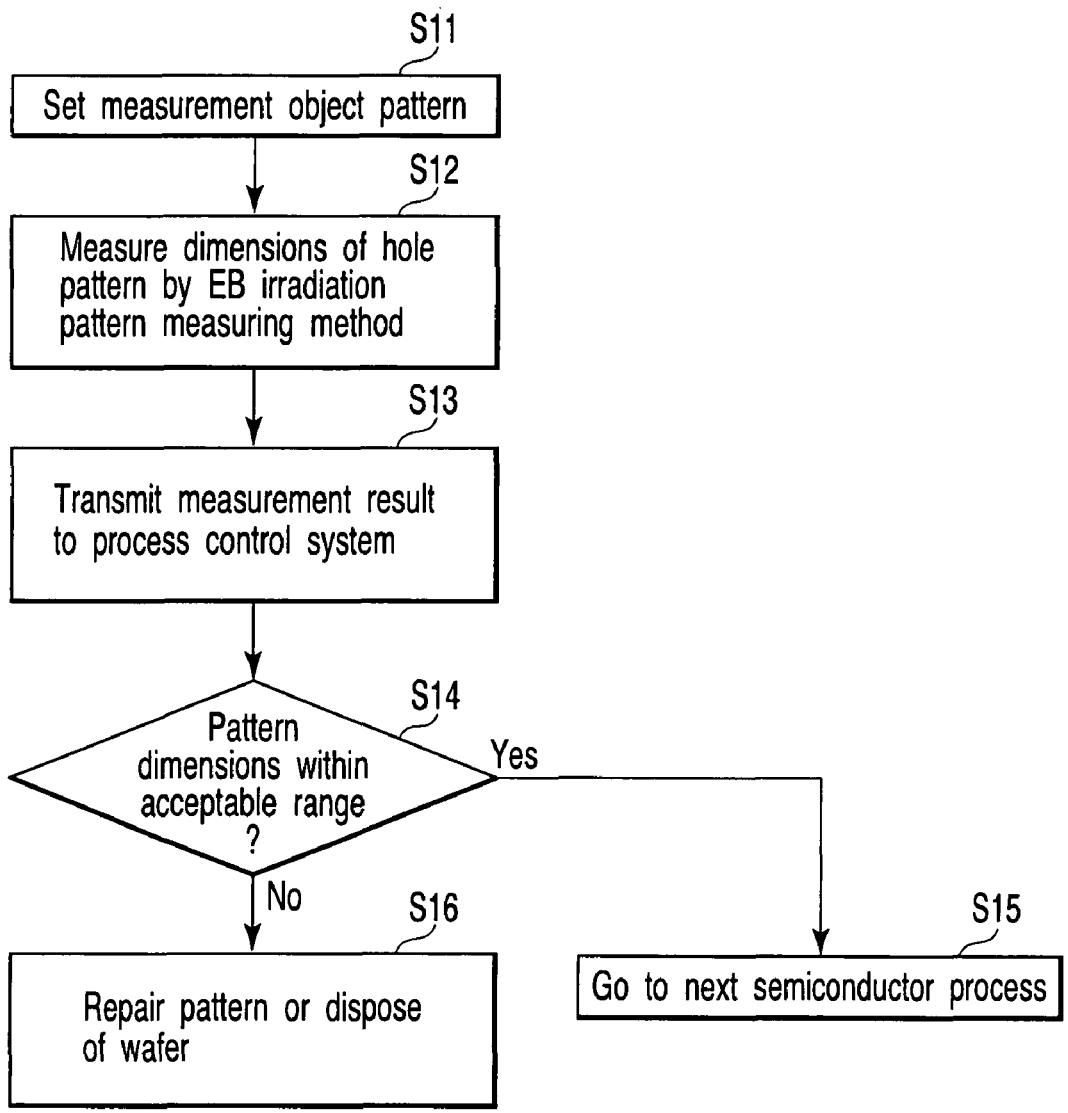
FIG. 5 is a diagram illustrating a flow of a semiconductor device manufacturing method of a third embodiment.

FIG. 5 is a diagram illustrating a flow of the method for manufacturing the semiconductor device of the present embodiment.

[Step S11]

First, a sample is prepared, which includes a pattern (measurement object pattern) as an object of measurement (here, object of pattern dimensions measurement).

As the measurement object pattern, a hole pattern formed in a resist film after a lithographic step, or a hole pattern after a etching process of an Si substrate or an oxide film is given. In the following description, the hole pattern is chosen as the measurement object pattern, but the present invention is applicable to a pattern other than the hole pattern.

[Step S12]

Next, according to the EB irradiation pattern measurement method, a wafer (sample) including a desired hole pattern is irradiated with EB, then the state of bottom of the hole is observed by detecting the signal of secondary electrons from the bottom of the hole pattern and the dimensions of the hole pattern (an measurement item used in judging whether the pattern is acceptable or rejectable). This is performed by using a CD-SEM having a system for calculating the feature parameters of hole pattern (for example, the diameter, the area, the major axis, the minor axis, or the like of hole pattern).

In the case where the object pattern is made of a plurality of sides (e.g., the object pattern is a rectangle or square), the measurement item used in the judging whether the object pattern is acceptable or rejectable is the length (dimension) of a specific side (e.g., length of long and short sides when the object patter is rectangle, length of one of the four sides when the object patter is square).

In addition, in the case where the object pattern is made of a closed curve (e.g., an ellipse or circle), the measurement item is the length of a specific part that defines the curve (e.g., major and minor axes when the object pattern is a ellipse, or a radius or diameter when the object pattern is a circle).

In addition, the size relating to the object pattern may be area. For example, in the case where the object pattern is a square or circle, the size may be the area of the square or circle.

Further, in the case where the object pattern is a plurality of object patterns (e.g., a plurality of line patterns), the size relating to the object pattern may be dispersions in spacing of the plurality of line patterns. With line patterns, the size may be dispersions in the length of the short side along the direction of the long side.

[Step S13]

After the completion of measurement of the hole pattern using the CD-SEM, the measurement result (pattern dimensions) is transmitted to a process control system in the manufacturing process.

[Step S14]

In the process control system, an acceptable range of pattern dimensions has been set up in advance. The process control system judges whether or not the measurement result transmitted from the CD-SEM falls in the acceptable range of the pattern dimensions

[Step S15]

As a result of the judgment, if the pattern dimensions are within the acceptable range, it is judged that the hole pattern has no problem and the next manufacturing process (next step) goes on. For example, in the case where the hole pattern is a hole of a resist film, the next step is an etching process using the resist film as a mask.

[Step S16]

On the other hand, if the pattern dimensions are out of the acceptable range, it is judged that the hole pattern has abnormal dimensions and the process is stopped without going to the manufacturing process.

In the case where the hole pattern having the abnormal dimensions is a hole of a resist film, the resist film is removed and the hole pattern is formed again by lithography (reworking). At this time, input parameters of the lithographic apparatus are adjusted so that the desired pattern dimensions are obtained.

In addition, in the case where the hole pattern having the abnormal dimensions is a hole pattern after processing of a substrate, reworking is impossible. Therefore, the wafer including the hole pattern having the abnormal dimensions is disposed of (discarded). At this time, input parameters of the etching apparatus are adjusted so that the pattern is processed into the desired dimensions.

In this manner, according to the present embodiment, it is judged whether or not the abnormal dimensions exist based on the measurement value measured by dimension measurement apparatus such as the CD-SEM, further, in the case where the abnormal dimensions is recognized, the input parameters of the manufacturing process apparatus are feedback controlled so that proper pattern dimensions are obtained, thereby stable semiconductor manufacturing can be maintained.

The present invention is not limited to the above described embodiments. For example, the present invention is also applicable to other hole pattern of a sample other than the semiconductor device such as a hole pattern of a photomask. In addition, the invention is also applicable to an object pattern other than the hole pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam irradiation method comprising:
   setting an observation region on a sample, the sample including an object pattern to be observed, and the observation region including the object pattern;
   setting an irradiation region on the sample, the irradiation region being to be irradiated with a charged particle beam, the irradiation region including the observation region and being larger than the observation region;
   setting a non-irradiation region in the irradiation region, the non-irradiation region failing to be irradiated with the charged particle beam;
   irradiating the irradiation region except the non-irradiation region with the charged particle beam; and
   irradiating the observation region with a charged particle beam after the irradiating the irradiation region except the non-irradiation region with the charged particle beam.

2. The method according to claim 1,
   wherein the irradiating the observation region with the charged particle beam is performed under higher magnifying power condition than the irradiating the irradiation region with a charged particle beam.

3. The method according to claim 1,
   wherein the non-irradiation region comprises a first region including a non-irradiation pattern failing to be irradiated with the charged particle beam and a second region, the second region being selected such that uniformity and symmetry of the charged particle beam in the irradiation region becomes higher when the non-irradiation region includes the second region than the non-irradiation region fails to includes the second region.

4. The method according to claim 3,
   wherein the irradiating the observation region with the charged particle beam is performed under higher magnifying power condition than the irradiating the irradiation region with a charged particle beam.

5. The method according to claim 3,
wherein the setting the non-irradiation region includes extracting the non-irradiated pattern,
the extracting the non-irradiated pattern includes setting feature amount that defines feature of shape of the non-irradiated pattern and extracting a pattern having the feature amount from patterns existing in the irradiation region, the patterns failing to include the object pattern.

6. The method according to claim 5,
wherein the irradiating the observation region with the charged particle beam is performed under higher magnifying power condition than the irradiating the irradiation region with a charged particle beam.

7. The method according to claim 1,
wherein the non-irradiation region includes a non-irradiated pattern failing to be irradiated with the charged particle beam,
the setting the non-irradiation region includes extracting the non-irradiated pattern,
the extracting the non-irradiated pattern includes setting feature amount that defines feature of shape of the non-irradiated pattern and extracting a pattern having the feature amount from patterns existing in the irradiation region, the patterns failing to include the object pattern.

8. The method according to claim 7,
wherein the irradiating the observation region with the charged particle beam is performed under higher magnifying power condition than the irradiating the irradiation region with a charged particle beam.

9. A method for manufacturing a semiconductor device comprising:
preparing a sample including an object pattern to be measured;
measuring a measurement item used in determining whether the object pattern is acceptable or unacceptable, the measuring the measurement item including irradiating the sample with a charged particle beam using a charged particle beam irradiation method and observing the object pattern, the charged particle beam irradiation method comprising setting an observation region on a sample, the sample including an object pattern to be observed, and the observation region including the object pattern; setting an irradiation region on the sample, the irradiation region being to be irradiated with a charged particle beam, the irradiation region including the observation region and being larger than the observation region; setting a non-irradiation region in the irradiation region, the non-irradiation region failing to be irradiated with the charged particle beam; irradiating the irradiation region except the non-irradiation region with the charged particle beam; and irradiating the observation region with a charged particle beam after the irradiating the irradiation region except the non-irradiation region with the charged particle beam;
determining whether or not a measured value of the measurement item falls within a predetermined range; and
proceeding to the next manufacturing process when the measured value falls within the predetermined range, repairing the object pattern or disposing the sample when the measured value does not fall within the predetermined range.

10. The method according to claim 9,
wherein the irradiating the observation region with the charged particle beam is performed under higher magnifying power condition than the irradiating the irradiation region with a charged particle beam.

11. The method according to claim 9,
wherein the non-irradiation region comprises a first region including a non-irradiation pattern failing to be irradiated with the charged particle beam and a second region, the second region being selected such that uniformity and symmetry of the charged particle beam in the irradiation region becomes higher when the non-irradiation region includes the second region than the non-irradiation region fails to includes the second region.

12. The method according to claim 11,
wherein the non-irradiation region includes a non-irradiated pattern failing to be irradiated with the charged particle beam,
the setting the non-irradiation region includes extracting the non-irradiated pattern,
the extracting the non-irradiated pattern includes setting feature amount that defines feature of shape of the non-irradiated pattern and extracting a pattern having the feature amount from patterns existing in the irradiation region, the patterns failing to include the object pattern.

13. The method according to claim 11,
wherein the irradiating the observation region with the charged particle beam is performed under higher magnifying power condition than the irradiating the irradiation region with a charged particle beam.

14. The method according to claim 12,
wherein the irradiating the observation region with the charged particle beam is performed under higher magnifying power condition than the irradiating the irradiation region with a charged particle beam.

15. The method according to claim 9,
wherein the non-irradiation region includes a non-irradiated pattern failing to be irradiated with the charged particle beam,
the setting the non-irradiation region includes extracting the non-irradiated pattern,
the extracting the non-irradiated pattern includes setting feature amount that defines feature of shape of the non-irradiated pattern and extracting a pattern having the feature amount from patterns existing in the irradiation region, the patterns failing to include the object pattern.

16. The method according to claim 15,
wherein the irradiating the observation region with the charged particle beam is performed under higher magnifying power condition than the irradiating the irradiation region with a charged particle beam.

* * * * *